(12) United States Patent
Sun et al.

(10) Patent No.: US 7,113,009 B2
(45) Date of Patent: Sep. 26, 2006

(54) PROGRAMMABLE FREQUENCY DIVIDER

(75) Inventors: Lizhong Sun, Nashua, NH (US); Bruce Del Signore, Hollis, NH (US); Axel Thomsen, Austin, TX (US); Douglas F. Pastorello, Hudson, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/807,852

(22) Filed: Mar. 24, 2004

(65) Prior Publication Data

US 2005/0212570 A1    Sep. 29, 2005

(51) Int. Cl.
H03K 25/00 (2006.01)
(52) U.S. Cl. .............................. 327/115; 377/47; 377/48
(58) Field of Classification Search ................. 377/47; 327/270, 271, 115, 117; 347/47, 48
See application file for complete search history.

(56) References Cited

U.S. PATENT DOCUMENTS

| | | | | |
|---|---|---|---|---|
| 3,813,610 A | * | 5/1974 | Kimura | ...................... 331/1 A |
| 5,425,074 A | * | 6/1995 | Wong | ........................... 377/47 |
| 6,061,418 A | * | 5/2000 | Hassoun | ...................... 377/47 |
| 6,617,893 B1 | | 9/2003 | Born et al. | |
| 6,618,462 B1 | | 9/2003 | Ross et al. | |
| 6,683,932 B1 | | 1/2004 | Wood | |
| 6,807,552 B1 | | 10/2004 | Bredin et al. | |
| 6,930,519 B1 | | 8/2005 | Fallahi et al. | |
| 6,952,125 B1 | * | 10/2005 | Ahn et al. | ................... 327/156 |
| 6,970,025 B1 | * | 11/2005 | Magoon et al. | ............. 327/115 |

OTHER PUBLICATIONS

Philips Semiconductors, Product Specification Data Sheet, HEF4017B, MSI, 5-Stage Johnson Counter, Jan. 1995.
Craninckx, Jan and Steyaert, Michiel S. J., "A 1.75-GHz/3-V Dual-Modulus Divide-by-128/129 Prescaler in 0.7-μm CMOS," IEEE Journal of Solid-State Circuits, vol. 31, No. 7, Jul. 1996, pp. 890-897.
Krishnapura, Nagendra and Kinget, Peter R., "A 5.3-GHz Programmable Divider for HiPerLAN in 0.25-μm CMOS," IEEE Journal of Solid-State Circuits, vol. 35, No. 7, Jul. 2000, pp. 1019-1024.
Perrott, Michael Henderson, "Techniques for High Data Rate Modulation and Low Power Operation of Fractional-N Frequency Synthesizers," Dissertation, Massachusetts Institute of Technology, Sep. 1997, pp. 1-199.

* cited by examiner

*Primary Examiner*—Dinh T. Le
(74) *Attorney, Agent, or Firm*—Zagorin O'Brien Graham LLP

(57) ABSTRACT

A divider is disclosed herein. The divider includes a sequence of divide stages programmably coupled to provide a variety of divide ratios. The divider also includes one or more multiplexers to feedback the output of a divide stage to the input of a divide stage earlier in the sequence of divide stages. The divider may also include duty cycle correction circuitry and self correction logic to correct abnormal logic states. The divide stages can operate in synchronism with each other. Multiplexer functionality, self correction circuitry functionality, and divide stage functionality may be implemented in a combination latch circuit.

26 Claims, 6 Drawing Sheets

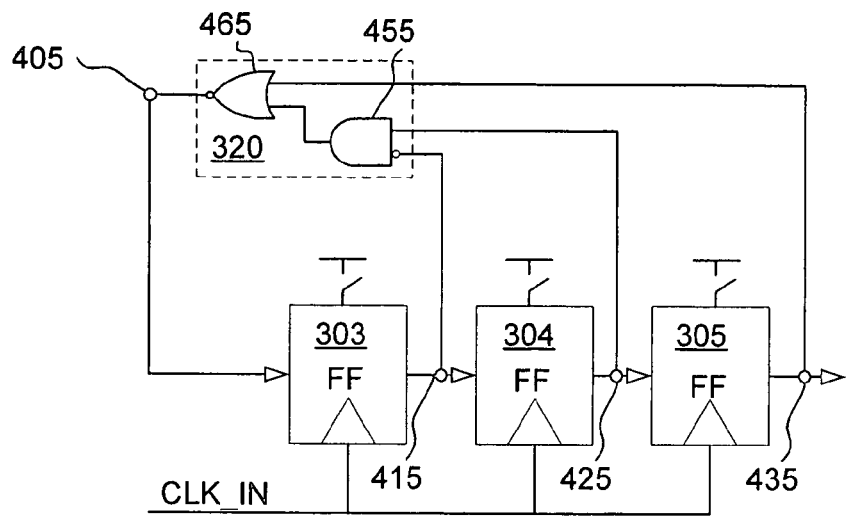
FIG. 4
|  | 415 | 425 | 435 |
|---|---|---|---|
| Cycle 1 | 0 | 0 | 0 |
| Cycle 2 | 1 | 0 | 0 |
| Cycle 3 | 1 | 1 | 0 |
| Cycle 4 | 1 | 1 | 1 |
| Cycle 5 | 0 | 1 | 1 |
| Cycle 6 | 0 | 0 | 1 |
FIG. 5
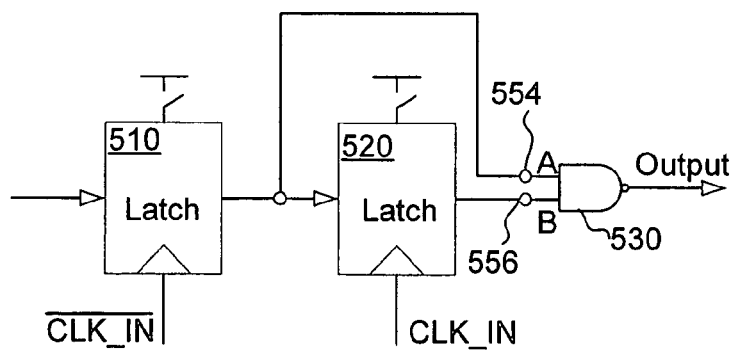
FIG. 6

PROGRAMMABLE FREQUENCY DIVIDER

BACKGROUND

1. Field of the Invention

This invention relates generally to frequency dividers, and more particularly to programmable frequency dividers.

2. Description of the Related Art

Frequency dividers used in high speed circuits are often required to provide a variety of different output frequencies from a single input frequency. One method of providing these different frequencies involves using a number of individual divider circuits that each apply different divide ratios to the input signal. The output of one of the divider circuits is then selected to provide the final output. A drawback of using multiple divider circuits in this way, however, is that undesired capacitive loads may be imposed on the signal being divided. These undesired capacitance loads may be particularly troublesome when dealing with high frequency clock signals. Additionally, using multiple divider circuits may require additional power, and in some cases additional chip area, resulting in an increase in production costs.

SUMMARY

An embodiment of the present invention provides a programmable frequency divider capable of applying any of multiple different divide ratios to an input signal. If necessary, the divider will self correct the duty cycle of its output to achieve a substantially 50 percent duty cycle. The frequency divider includes a sequence of divide stages, and at least one multiplexer to selectively feed back the output of one or more divide stages to the input of another divide stage earlier in the sequence. Various embodiments of the frequency divider also include self correction logic to detect abnormal logical states, and to bring the frequency divider back into a normal logical state if an abnormal state occurs.

At least one embodiment of the frequency divider includes more than one multiplexer, each of which couples the outputs of various stages within the sequence of divide stages to the inputs of other divide stages, or to an output of the frequency divider. Each multiplexer can be programmably controlled to effectively alter the sequence of divide stages and achieve a desired divide ratio. In at least one embodiment, one or more of the multiplexers are combined with one or more portions of self correction logic and implemented as part of a latch circuit.

In various embodiments, the divide stages of the frequency divider each include clock inputs connected to an input signal to be divided. Thus, each stage of the frequency divider is clocked in synchronism with each other, and with the signal to be frequency divided. Additionally, in certain embodiments of the present invention, one or more the divide stages includes an activation input, whereby individual stages, or groups of stages, can be selectively turned off if not used for the desired divide ratio.

In one embodiment, the invention provides a clock generation circuit. The clock generation circuit includes a divider having a sequence of synchronous divide stages arranged to provide multiple different divide ratios, and one or more multiplexers that selectively feed back an output of a divide stage to an input of another divide stage earlier in the sequence. The frequency divider may include an input connected to receive an input clock signal, for example, from a voltage controlled oscillator, and an output to provide a divided version of the input clock signal.

Various embodiments of the invention provide methods that include providing an input clock to a divider that includes a sequence of divide stages, clocking each of the divide stages using the input clock, and selectively feeding back an output of one divide stage to an input of another divide stage earlier in the sequence of divide stages.

BRIEF DESCRIPTION OF THE DRAWINGS

The present invention may be better understood, and its numerous objects, features, and advantages made apparent to those skilled in the art by referencing the accompanying drawings.

FIG. 4 is a block diagram illustrating a self correction logic for a divide by 6 divide ratio according to an embodiment of the present invention.

FIG. 5 is a truth table illustrating logical states at selected nodes during a divide by six operation.

FIG. 6 is a block diagram illustrating a duty cycle correction circuit according to an embodiment of the present invention.

The use of the same reference symbols in different drawings indicates similar or identical items.

DESCRIPTION OF THE PREFERRED EMBODIMENT(S)

Figure 1:
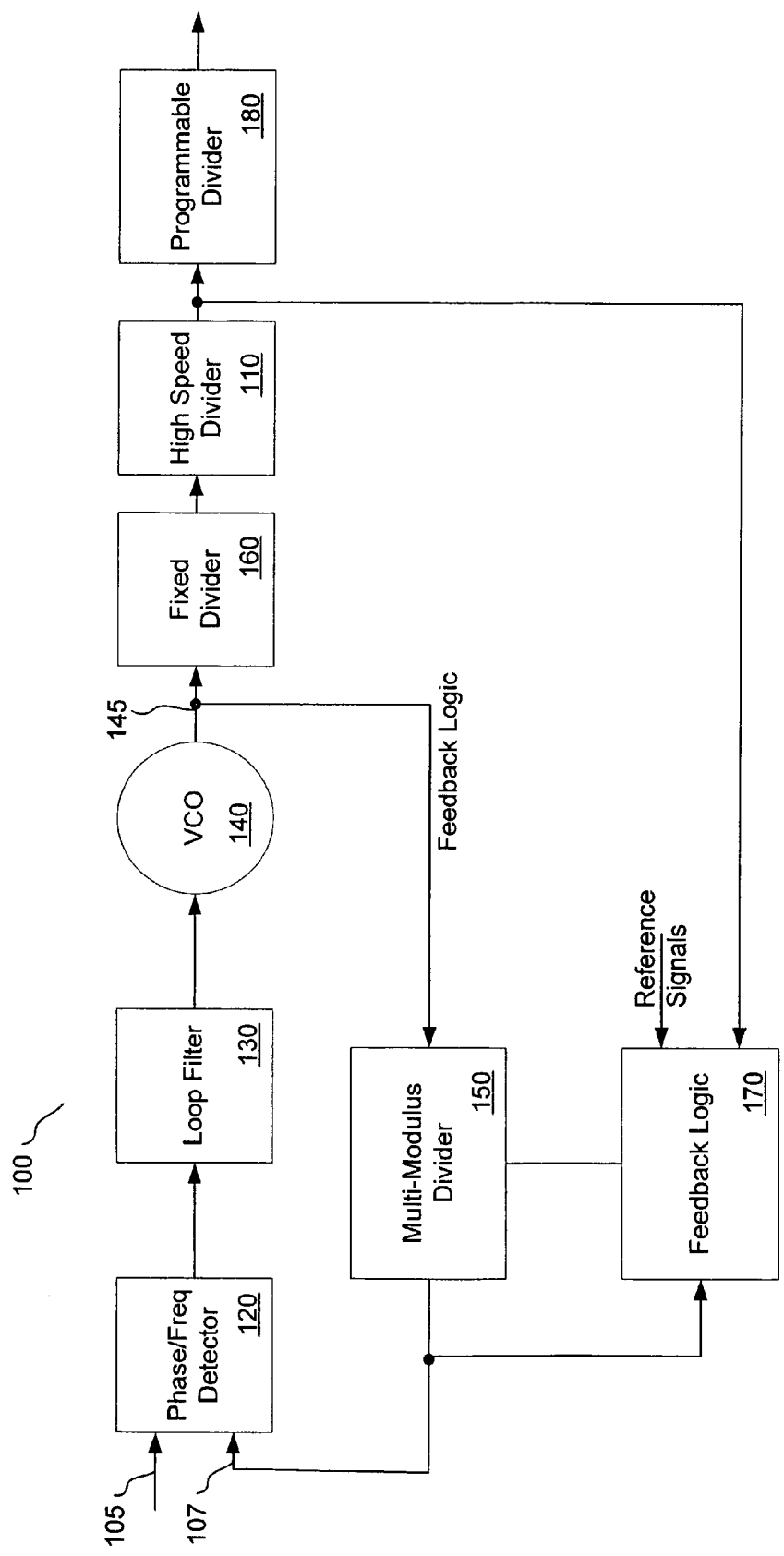
FIG. 1 is a block diagram illustrating a dual feedback phase-locked loop including a frequency divider according to an embodiment of the present invention.

Referring first to FIG. 1, a phase-locked loop 100 having a dual feedback path structure, including a frequency divider such as high-speed divider 110, is illustrated according to an embodiment of the present invention. The phase-locked loop 100 includes phase/frequency detector (PFD) 120, which detects a phase difference between a clock signal at node 105 and a feedback signal at node 107. The output of the PFD 120 is provided to loop filter 130, which generates a voltage proportional to the phase/frequency difference detected by PFD 120. The voltage generated by low pass filter 130 is provided to voltage controlled oscillator 140 which generates an output signal at node 145. The frequency and phase of the signal at node 145 is dependent upon the phase difference between the input clock at node 105 and the feedback signal at node 107. Multi-modulus divider 150, which lies in the first feedback path of the phase-locked loop 100, divides the frequency of the signal at node 145 and provides the divided signal to input 107 of PFD 120.

The output of VCO 140 is provided to an initial divide stage 160, which may divide the frequency at node 145 in preparation for providing the high-speed divider 110 with a signal to be further divided. The high-speed divider 110 is, in at least one embodiment, a programmable, synchronous divider capable of providing multiple different divide ratios. The output of high-speed divider 110 can be provided to logic 170, which lies in the second feedback path of phase-locked loop 100, and also to division stage 180. The output of division stage 180 is used to provide a divided signal, for example, a clock signal to other circuitry (not shown).

Various implementations of phase-locked loops, frequency locked loops, and the like are well-known to those skilled in the art, and dividers according to various embodiments of the present invention can be adapted for use in any suitable form of these or other similar control loops. It should also be appreciated, however, that a divider according to an embodiment of the present invention is not limited to use in phase-locked loops, frequency locked loops, or the like. Instead, a divider according to an embodiment of the present invention, can be incorporated into, or used in conjunction with, any suitable circuit, device, or application in which an input signal is to be frequency divided.

Figure 2:
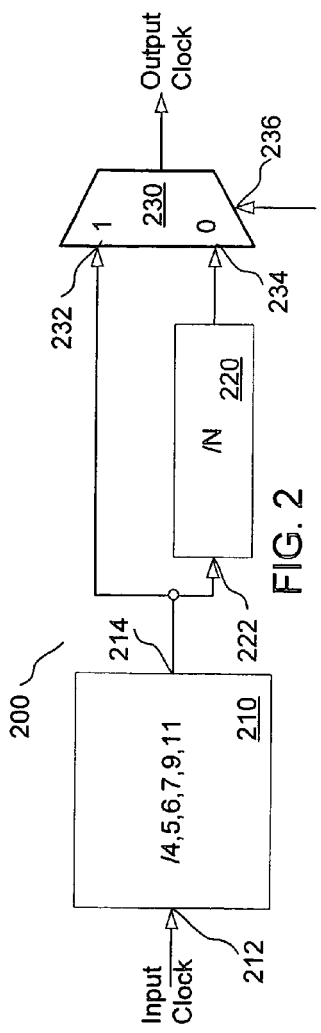
FIG. 2 is a block diagram illustrating a two-step programmable divider including a high-speed divider according to an embodiment of the present invention.

Referring next to FIG. 2, a two-stage divider is illustrated according to an embodiment of the present invention, and is designated generally as multistage divider 200. The multistage divider 200 includes first stage divider 210, second stage divider 220, and output multiplexer 230. First stage divider 210 receives an input clock at input 212 and produces a divided clock at output 214. The divided clock at output 214 is provided to first input 232 of multiplexer 230, and to input 222 of second stage divider 220. Second stage divider 220 further divides the divided clock at input 222 by a programmable amount.

The output of second stage divider 220 is provided to the second input 234 of multiplexer 230, which may then select either the divided signal produced by first stage divider 210 or the further divided signal produced by second stage divider 220, based on a control signal at control input 236. If the signal at control input 236 indicates that the output of first stage divider 210 is to be selected, the divided clock signal produced by first stage 210 will be used as the output clock of multistage divider 200. If, however the control signal at input 236 indicates that the output of second stage divider 220 is to be selected, the output of second stage divider 220 will be used as the output clock.

In at least one embodiment, first stage divider 210 is a high-speed divider, capable of dividing signals in the multiple-gigahertz range. For example, in at least one embodiment, the input clock is within a frequency range of between approximately 4.8 gigahertz and 5.9 gigahertz, while the output clock is in a frequency range of between approximately 1.4 gigahertz and 436 megahertz. It should be appreciated, however, that the present invention is not limited to these stated ranges.

In at least one embodiment, first stage divider 210 is programmable to apply multiple different divide ratios. For example, one embodiment provides divide ratios of 1/4, 1/5, 1/6, 1/7, 1/9, and 1/11, to form core ratios from which other divide ratios can be derived. A divider capable of providing these core ratios can be implemented as a high speed divider requiring only a limited number of bits for programmability. Other divide ratios can be achieved by combining the high speed divider with either lower-speed programmable dividers, or fixed dividers. For example, if second stage divider 220 provides a divide ratio of 1/2, the combination of first stage divider 210 and second stage divider 220 can produce divide ratios of 1/8, 1/10, 1/12, and so on. If second stage divider 220 provides a divide ratio of 1/14, the combination of first stage divider 210 and second stage divider 220 can produce divide ratios of 1/56, 1/70, etc.

Referring again briefly to FIG. 1, it can be seen that additional dividers, such as divider 160, can be used in conjunction with a divider, such as divider 200, to achieve an even wider variety of programmable divide ratios. Since lower-speed programmable dividers may be easier to implement and/or more efficient, at least one embodiment of a divider according to the present invention provides a wide range of divide ratios in an efficient manner by combining a high speed programmable divider with both a low speed programmable divider and one or more fixed ratio dividers.

Figure 3:
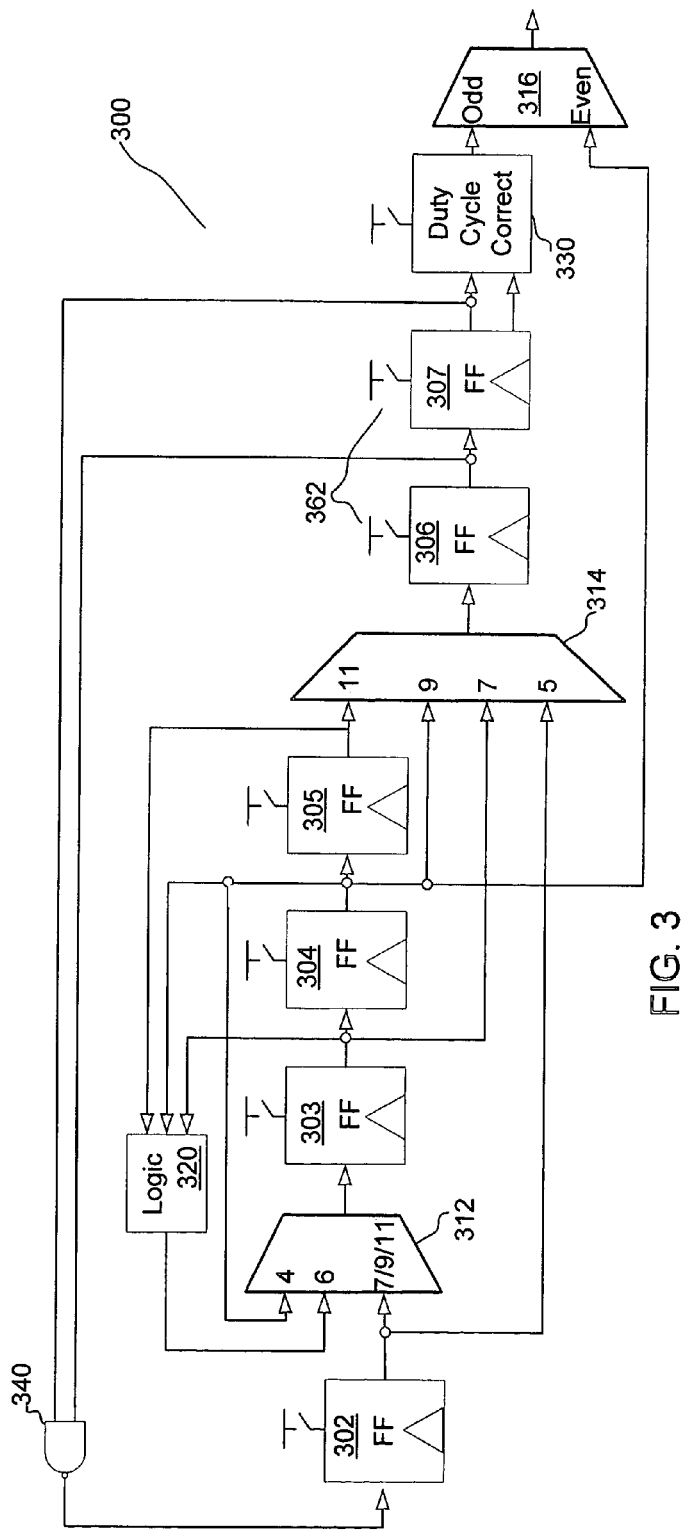
FIG. 3 is a block diagram illustrating a programmable frequency divider according to an embodiment of the present invention.

Referring next to FIG. 3, an embodiment of a divider 300 according to the present invention will be discussed. The divider 300 includes a sequence of stages 302–307 connected either directly or through multiplexers 312 and 314. The divider 300 includes a plurality of feedback paths combined through multiplexers 312 and 314 for programmability. It should be noted that each of the divide stages 302–307 operates in synchronism with the other divide stages. Clocking the divide stages so that they operate in synchronism with each other helps to prevent retiming issues that might otherwise occur in non-synchronous embodiments.

For power efficiency, the divide stages 302–307 are turned on only as needed, and may be controlled, for example, by a decoder (not shown). In at least one embodiment, not all divide stages are used for every divide ratio. For example, a 1/4 divide ratio may use only stages 303 and 304 to operate, while a 1/6 divide ratio uses stages 303, 304 and 305. A 1/5 divide ratio may use stages 302, 306 and 307, while a 1/7 divide ratio uses stages 302, 303, 306 and 307. A 1/9 divide ratio uses stages 302, 303, 304, 306 and 307, and a 1/11 divide ratio uses all stages 302–307 to operate.

The multiplexer 312 receives feedback from the output of stages 303–305, as modified by logic circuitry 320, from the output of stage 304, and from the output of stage 302. Multiplexer 314 receives output from stages 302, 303, 304 and 305. Multiplexer 316 receives the outputs corresponding to the 1/4 and 1/6 divide ratios from stage 304, and the outputs corresponding to duty cycle corrected odd divide ratios from stage 307. The specific divide ratio applied to signals at the odd or even inputs of multiplexer 316 depends on the programmed divide ratios.

In at least one embodiment, the maximum achievable operation frequency may be limited by the node that has the largest delay, so the multiplexers are arranged in locations that allow each flip-flop (divider stage) to have about the same loading. In other words, each divider stage drives a similar number of gates as other divider stages. It should be appreciated, however, that such a balanced-load approach is not necessary for all embodiments.

Logic 320 and AND gate 340 are used, in one embodiment, to provide self correction logic to correct abnormal states of divider 300, if such abnormal states occur. Duty cycle correction 330 operates to correct duty cycle distortion that occurs when applying odd divide ratios, and to bring the duty cycle of odd divide ratios back to substantially 50 percent.

Referring next to FIGS. 3–5, an example of how divider 300 operates to achieve a 1/6 divide ratio will be discussed according to an embodiment of the present invention. Each divide stage 302–307 of divider 300 includes an activation input 362, which can be used to turn off or disable respective divide stages not being used for the programmed divide ratio. When a 1/6 divide ratio is programmed, stages 302, 306, and 307 are not used, and so respective activation switches 362 may be opened to inactivate the stages. Duty cycle correction 330 also includes an activation switch, which is open in this example, because a 1/6 divide ratio is taken from the output of divide stage 304, and duty cycle correction is not used. With the activation switches for divide stages 302, 306 and 307, and duty cycle correction 330 all open, only portions of divider 300 actually being used for the 1/6 divide ratio are turned on.

Note that multiplexer 312 is not illustrated in FIG. 4 for clarity of discussion. It should be appreciated, however, that the connection between logic 320 and divider stage 303 illustrated in FIG. 4 can be formed by providing a programmable control signal to a control input of multiplexer 312, thus causing multiplexer 312 to select the output of logic 320 for connection to the input of divide stage 303. The output of logic 320 is illustrated in FIG. 4 as node 405.

FIG. 5 is a truth table illustrating the logical state of nodes 415, 425, and 435 during six cycles of signal CLK_IN. Assume that during cycle 1, nodes 415, 425 and 435 each have a logical value of 0. The values of each node will cycle through the stages illustrated in FIG. 5 during subsequent clock cycles. The 1/6 divide ratio output is taken from node 425, and as can be seen from FIG. 5, has a logical value of 1 for three cycles and a logical value of 0 for three cycles. The results is that the output taken from node 425 has a 50 percent duty cycle, and a frequency 1/6 that of the signal CLK_IN. Similar truth tables can be easily constructed for other divide ratios.

One embodiment of logic 320 includes logic gates 455 and 465. Logic 320 can be used to detect abnormal states of divide stages 303–305 during a divide by 6 operation. For example, if divide stages 303–305 are powered up in a state where the logical value at node 415 is 0, the logical value at node 425 is 1, and the logical value at node 435 is 0. Logic 320 forces the next logical value at nodes 415, 425 and 435 to be 001, which, respectively, is a normal state for a divide by 6 operation. Likewise, logic 320 will correct an abnormal state of 101 by causing the next state to be 110, which is also a normal state for a divide by 6 operation.

It may be appreciated by those skilled in the art that divide stages 303, 304 and 305 are used as a Johnson counter to achieve a 1/6 divide ratio. Other divide ratios may employ various divide stages in a manner similar to a Johnson counter, a ring counter, or otherwise. The manner in which the different divide stages are effectively connected to each other is dependent, in at least one embodiment, on programmable signals provided to control inputs of multiplexers 312, 314 and 316. Each multiplexer receives, at its input, the output of one or more divide stages. The control signal provided to a particular multiplexer causes that multiplexer to select the appropriate divide stage output to connect to the input of another divide stage, or to an output. In effect, one or more of the multiplexers may programmably alter the number of divide stages, or the sequence in which divide stages are coupled together, and provides feedback from one divide stage to an earlier divide stage in the sequence of divide stages.

Referring next to FIG. 6, a description of duty cycle correction according to an embodiment of the present invention will be discussed. One result of the way in which a divider according to an embodiment of the present invention operates is that a 1/4 divide ratio and a 1/6 divide ratio naturally generate a 50 percent duty cycle output. However, odd divide ratios have duty cycle distortion (e.g. their duty cycles are not 50 percent). With the divider illustrated in FIG. 6, the duty cycle distortion for odd ratios is 1/2 of an input clock cycle (before duty cycle correction). The duty cycle correction logic 330 is used to correct the duty cycle distortion in odd ratios to a substantially 50 percent duty cycle. According to one embodiment, a single latch delay, combined with a single AND logic gate, may be used to remove this 1/2 cycle distortion.

Figure 7:
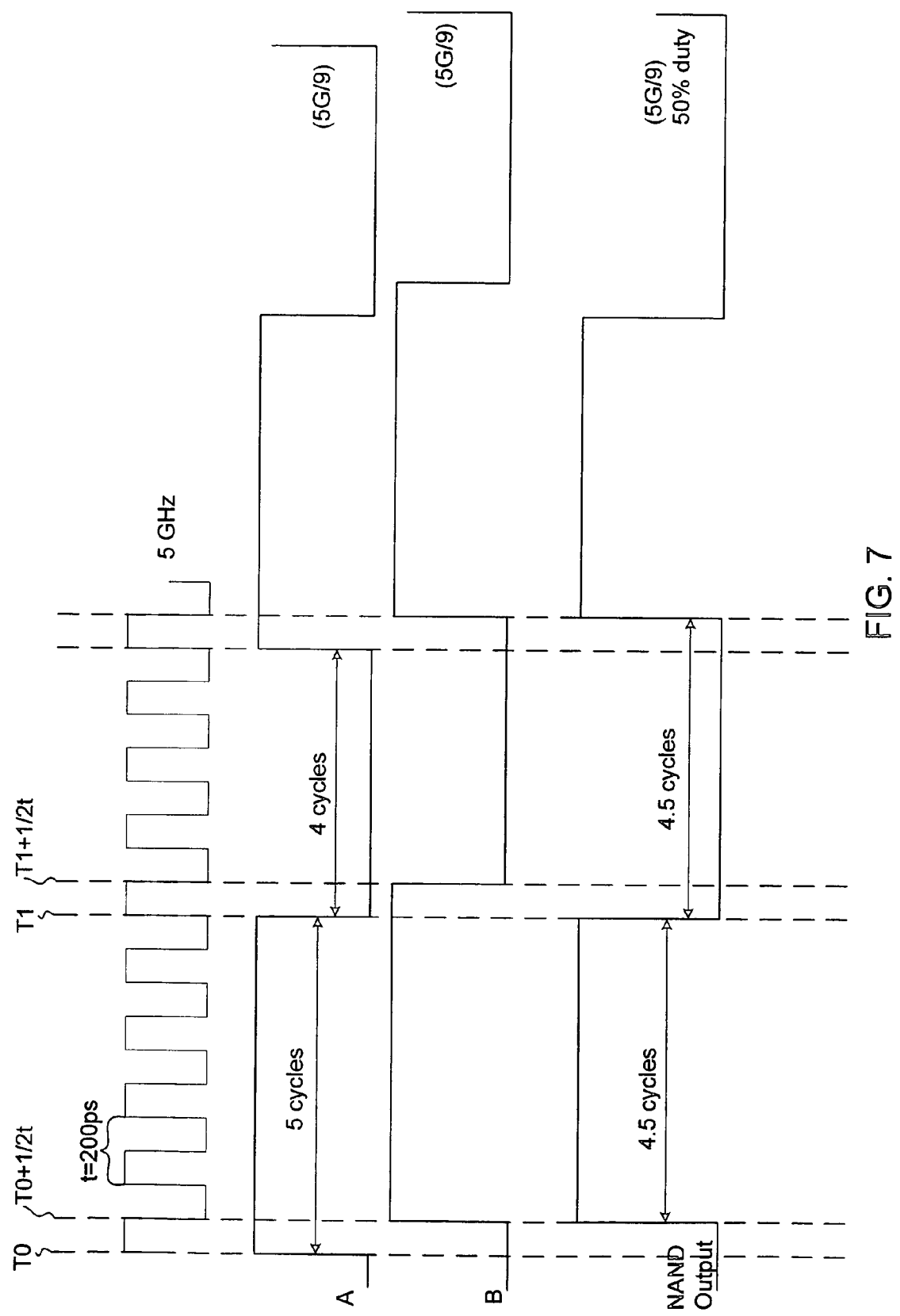
FIG. 7 is a timing diagram illustrating the function of the duty cycle correction circuit of FIG. 6 according to an embodiment of the present invention.

Referring next to FIGS. 6 and 7, a timing diagram illustrating the operation of the circuit shown in FIG. 6 with respect to a 1/9 divide ratio will be discussed according to an embodiment of the present invention. In this example, latches 510 and 520 are clocked using the signal CLK_IN. The signal CLK_IN is, in this example, a clock signal having a frequency of 5 gigahertz, which corresponds to a period of 200 pico seconds. Note that latches 510 and 520 operate in synchronism with either the rising or falling edge of the signal CLK_IN. Both signal A and signal B have frequencies equal to 5/9 gigahertz, and are produced by dividing the 5 gigahertz CLK_IN signal using a divider such as that illustrated in FIG. 3. Signal A, on node 554, goes high at time T0, and remains high until time T1. Signal B, on node 556, goes high at time T0+½t, and remains high until time T1+½t, where t is the period of the input clock. Note that circuit 500 results in signal B being delayed from signal A by ½ of a period of the signal CLK_IN. Delaying the input signals to AND gate 530 in this manner results in an output having a 50 percent duty cycle, even though the duty cycle of both input signals A and B have non-50 percent duty cycles.

In at least one embodiment, duty cycle correction circuit 500 includes both latches 510 and 520, as well as AND gate 530. In other embodiments, duty cycle correction logic 500 includes AND gate 530, while latches 510 and 520 are maintained as part of a final divide stage, such as stage 307 illustrated in FIG. 3. Note that various implementations of the logic illustrated in FIG. 6 may be employed by those skilled in the art consistent with the teachings set forth herein, and that duty cycle correction circuitry is not limited to the circuitry specifically illustrated in FIG. 6.

Figure 8:
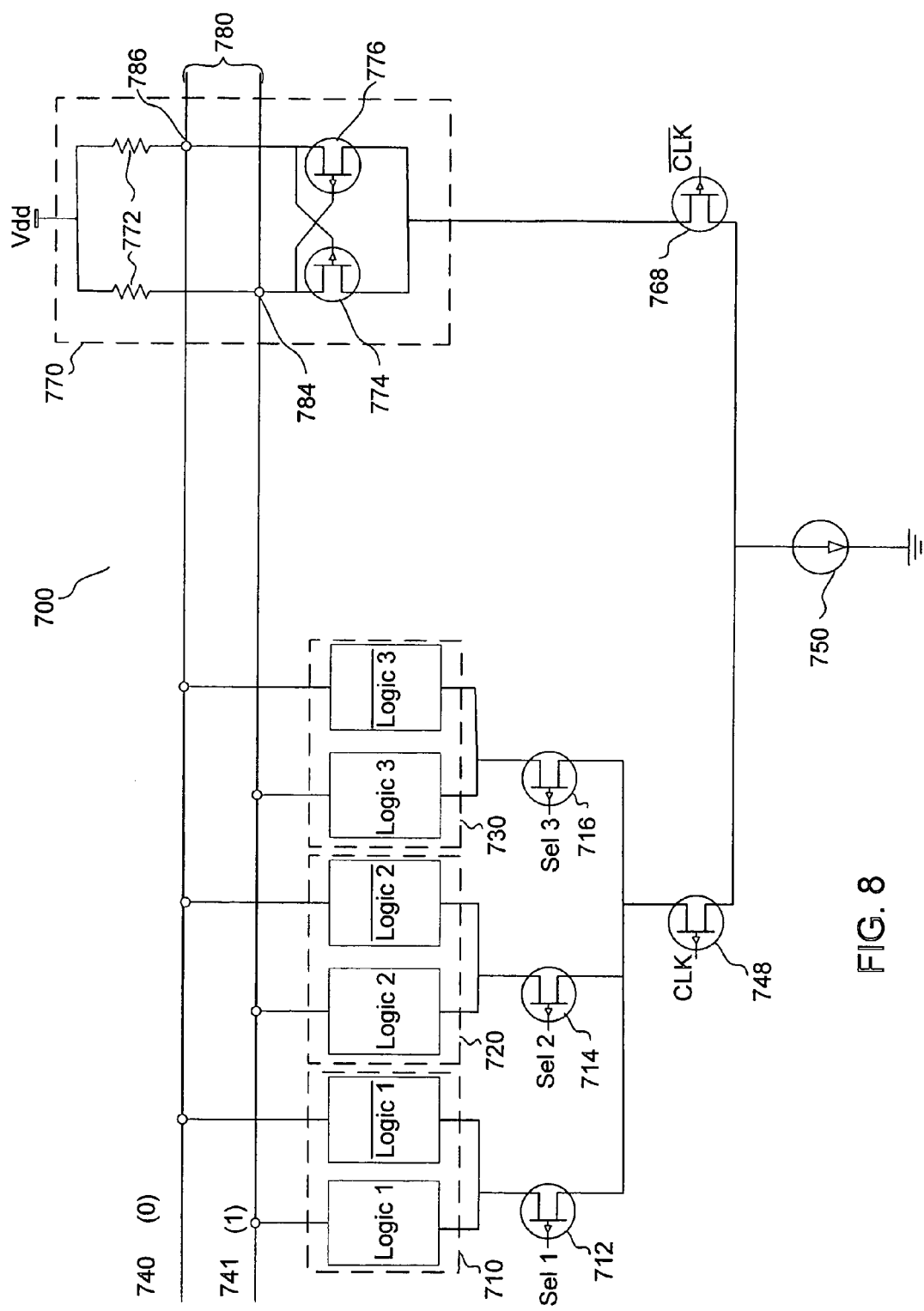
FIG. 8 is a combination block diagram/schematic diagram illustrating a latch circuit used to implement self correction logic and multiplexer functionality according to an embodiment of the present invention.

Referring next to FIGS. 3 and 8, a latch incorporating self correction logic and multiplexer selection circuitry is illustrated according to an embodiment of the present invention. The latch 700 includes three logic sections, first logic section 710, second logic section 720, and third logic section 730. One side of a non-inverted portion of each logic section is coupled to high data line 741 and one side of an inverted portion of each logic sections is coupled to low data line 740. The three logic sections are each also coupled to a constant current source 750 through a clocked switch 748, and respective selection switches 712, 714 or 716.

Low data line 740 is connected to a first side of latching circuit 770 and high data line 741 is connected to the opposing side. Each side of latching circuit 770 includes a limiting resistor 772 having one side connected to a voltage source, such as VDD, and a respective latching transistor 774 or 776, respectively. The latching transistors 774 and 776 are cross connected in a matter commonly known to those skilled in the art. The latching circuit 770 is connected to constant current source 750 through clocked switch 768, which receives an inverted clock signal, compared to the clock signal received by clocked switch 748.

In operation, differential output 780 provides an output equivalent to combined logic 320, multiplexer 312, and a master latch portion of divide stage 303. For example, first logic portion 710 may be used to implement the same logic implemented by logic 320. Second logic portion 720 may be used to connect a feedback path from the output of stage 304 to the latch portion 770 to achieve a 1/4 divide ratio. Third logic portion 730 may be used to apply the output of divide stage 302 to latch portion 770 for 1/7, 1/9, and 1/11 divide ratios. Merging the functionality of correction logic 320, multiplexer 312 and divide stage 303 in this manner can reduce the overall timing delay of a divider according to an embodiment of the present invention.

For example, when frequency divider 300 of FIG. 3 is programmed to provide a 1/6 divide ratio, the output of stages 303, 304, and 305 are fed through logic 320 to multiplexer 312, which selects the appropriate input to connect the output of logic 320 to the input of divide stage 303. Latch 700 may be substituted for logic 320, multiplexer 312, and divide stage 303. The operation of latch 700 is as follows. Selection switch 712 is activated when a 1/6 divide ratio is desired, and selection switches 714 and 716 are deactivated. First logic 710 indicates a logic 1 whenever logic 320 would normally indicate a logic 1. Assume for the purpose of this example that logic 710 indicates a logic 1 value then, upon receipt of a clock signal at clock switch 748, low data line 740 and high data line 741 are connected to constant current source 750 through selection switch 712 and clocked switch 748. Connecting data lines 740 and 741 in this manner effectively places a logic 1 on node 784, and a logic 0 on node 786 of latching circuit 700.

When the clock signal is deasserted, clocked switch 748 opens, and clocked switch 768 closes. While clocked switch 768 is closed, nodes 784 and 786 maintain their previous value, which was established by first selection logic 710. Thus, differential output 780 of latch 700 reflects the application of both logic 320 and the selection process of multiplexer 312. Since this value is latched in synchronism with the clock signal, latch 700 also performs the functions of divide stage 303.

In a similar manner, if a 1/7, 1/9, or 1/11 divide ratio is programmed, selection switch 716 is closed, and selection switches 712 and 714 are opened. When the clock signal is asserted, clocked switch 748 connects one of the data lines 740 or 741 to constant current source 750 through third logic 730, thereby setting the value of nodes 784 and 786 according to the output of third logic 730. With the logic value of nodes 784 and 786 set, the clock can be deasserted, thereby permitting latching portion 770 of latch 700 to be connected to constant current source 750 through clocked switch 768, and causing the values on nodes 784 and 786 to be latched.

It will be appreciated that various embodiments of a divider according to the present invention may or may not employ the latch illustrated in FIG. 7. In at least one embodiment, however, latch 700 or its equivalent is employed to reduce timing delays into a single logic delay. Additionally, other portions of divider 300 may employ a latch that combines the functionality of logic sections, multiplexers, and/or divide stages. For example, at least one embodiment employs a combined latch in place of NAND gate 340 and divide stage 302, in addition to using combined latch 700 in place of logic 320, multiplexer 312, and divide stage 303. In addition, multiplexer 314 may be combined with divide stage 306.

Figure 9:
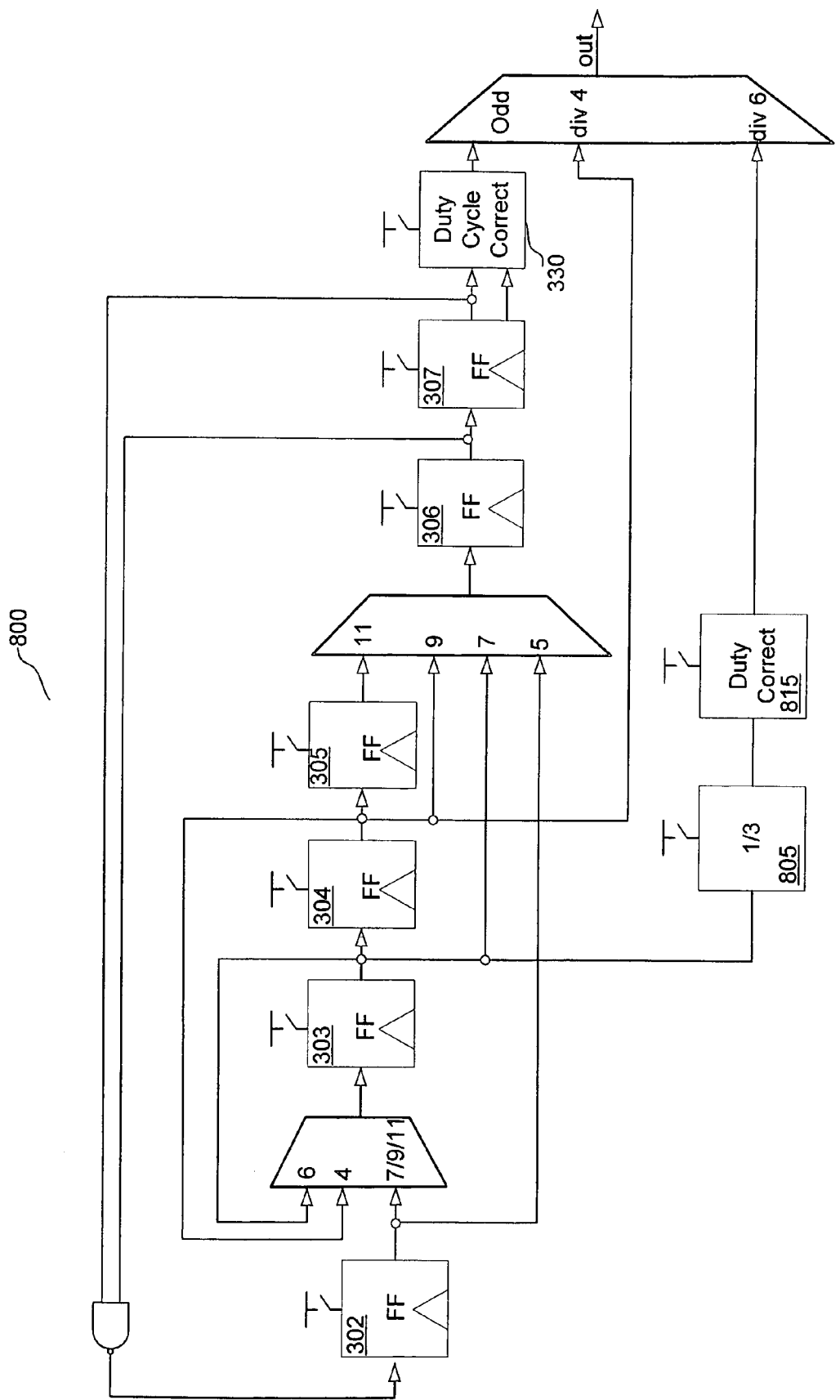
FIG. 9 is a block diagram illustrating a frequency divider according to an alternate embodiment of the present invention.

Referring next to FIG. 9, a divider according to another embodiment of the invention is illustrated, and is designated generally divider 800. Divider 800 illustrates a way in which a 1/6 divide ratio can be achieved by first employing a 1/2 divide ratio at divider stage 303, and then employing a 1/3 divide ratio using a fixed divider 805. Note that, unlike the embodiment of the divider illustrated in FIG. 3, the embodiment illustrated in FIG. 9 does not employ abnormal-state correction logic. Also note, that duty cycle correction logic 815 is used to correct cycle distortion generated by the 1/3 divide ratio divider 805. A similar approach to generating a 1/6 divide ratio, not illustrated, involves first applying a 1/3 divide ratio using a programmable divider, and then applying a fixed 1/2 divide ratio. It will be appreciated that programmable 1/3 or 1/2 ratio dividers may be used in place of fixed ratio dividers.

The previous discussion has focused primarily on a divider designed to implement a plurality of "core" divide ratios, e.g. 1/4, 1/5, 1/6, 1/7, 1/9, and 1/11. It should be appreciated, however, that dividers implementing other divide ratios can be implemented using the teachings set forth herein. A divider capable of providing these core ratios can be implemented as a high speed divider requiring only a limited number of bits required programmability. Other divide ratios can be achieved by combining such a high speed divider with either lower-speed programmable dividers, or fixed dividers. Since some lower-speed programmable dividers are either easier to implement, more efficient, or both, at least one embodiment of a divider according to the present invention, provides a wide range of divide ratios in an efficient manner by combining a high speed programmable divider and a low speed programmable divider.

Although various embodiments of the present invention have been shown and described in detail herein, many other varied embodiments of the present invention may be practiced without departing form the teachings set forth herein. These embodiments can be readily constructed by those skilled in the art. Accordingly, the present invention is not intended to be limited to the specific forms set forth herein, but to the contrary, include such alternatives, modifications, and equivalents as can be reasonably included within the spirit and scope of the invention.

What is claimed is:

1. A frequency divider comprising:
   a sequence of divide stages coupled to selectively provide a plurality of different divide ratios;
   at least one multiplexer coupled to selectively feed back an output of at least one of the divide stages to an input of another of the divide stages earlier in the sequence of divide stages;
   a duty-cycle stage coupled to at least one of the divide stages to correct a duty cycle of an output of at least one of the divide stages having an odd divide ratio; and
   self-correction logic coupled to outputs of at least some of the divide stages to correct an abnormal state of the frequency divider.

2. The frequency divider of claim 1 further comprising at least one input coupled to receive a programmable control signal indicating which of the plurality of different divide ratios to apply.

3. The frequency divider of claim 1 further comprising an input to receive a signal to be divided and wherein respective ones of the divide stages include a clock input coupled to the signal to be divided.

4. The frequency divider of claim 1, wherein the duty-cycle stage includes:
   a first input to receive a first signal having an unbalanced duty cycle;
   a second input to receive a second signal, wherein the second signal is a delayed version of the first signal; and
   logic to generate a signal having a balanced duty cycle using the first signal and the second signal.

5. The frequency divider of claim 1 wherein respective ones of the divide stages include an activation input coupled to receive an activation signal to selectively turn off one or more divide stages if the one or more divide stages are not used for a selected divide ratio.

6. The frequency divider of claim 1 further including a latch circuit in at least one of the divider stages, the latch circuit including:
   the self-correction logic; and
   selection circuitry implementing the at least one multiplexer.

7. A frequency divider comprising:
   a plurality of divide stages programmably coupled to provide a plurality of different divide ratios;

wherein one or more of the divide stages is turned off when not used for a programmed divide ratio; and self-correction logic coupled to outputs of at least some of the divide stages to correct an abnormal state of the frequency divider.

8. The frequency divider of claim 7 further comprising at least one multiplexer coupled to selectively couple an output of a first one of the divide stages to an input of a second one of the divide stages.

9. The frequency divider of claim 7 further comprising a duty-cycle stage coupled to correct a duty cycle of an output of at least one of the divide stages having an odd divide ratio.

10. The frequency divider of claim 9, wherein the duty-cycle stage includes:
a first input to receive a first signal having an unbalanced duty cycle;
a second input to receive a second signal, wherein the second signal is a delayed version of the first signal; and
logic to generate a signal having a balanced duty cycle using the first signal and the second signal.

11. The frequency divider of claim 7 further including a latch circuit, the latch circuit including:
the self-correction logic; and
selection circuitry implementing a multiplexer.

12. The frequency divider of claim 7, wherein the plurality of divide stages are programmably coupled to produce an output having a divide ratio selected from the following group of divide ratios: 1/11, 1/9, 1/7, 1/6, 1/5, and 1/4.

13. The frequency divider of claim 7 further comprising switches for selectively turning off the one or more divide stages according to whether the one or more divide stages is being used for the programmed divide ratio.

14. The frequency divider of claim 7 further comprising respective switches selectively coupling respective ones of the divide stages to a power supply node according to whether the respective ones of the divide stages are being used for the programmed divide ratio.

15. A clock generation circuit comprising:
an input coupled to receive a signal having a first frequency;
an output coupled to provide a clock signal having a frequency derived from the first frequency;
a divider coupled to the input and the output, the divider including:
a sequence of synchronous divide stages to provide a plurality of different divide ratios;
one or more multiplexers to selectively feed-back an output of a divide stage to an input of a divide stage earlier in the sequence;
wherein respective ones of the divide stages are selectively coupled to a power supply node through switches to selectively power divide stages used for a programmed divide ratio and at least other one of the divide stages not used for the programmed divide ratio is decoupled from the power supply node; and
wherein the divider further includes a duty-cycle stage coupled to correct a duty cycle of an output of one or more of the divider stages having an odd divide ratio, the duty-cycle stage including,
a first input to receive a first signal having an unbalanced duty cycle;
a second input to receive a second signal, wherein the second signal is a delayed version of the first signal; and
logic to generate a third signal having a balanced duty cycle using the first signal and the second signal.

16. The clock generation circuit of claim 15 wherein said divider includes self-correction logic coupled to outputs of at least some of the divide stages to correct abnormal states of the divider.

17. The clock generation circuit of claim 16 wherein said divider further includes a latch circuit in at least one of the divide stages, the latch circuit including:
the self-correction logic; and
selection circuitry implementing at least one of the one or more multiplexers.

18. A method comprising:
providing an input clock to a divider, the divider including a sequence of divide stages coupled to selectively provide a plurality of different divide ratios;
clocking each of the divide stages with the input clock;
selectively feeding back an output of a first one of the divide stages to an input of a second one of the divide stages earlier in the sequence of divide stages;
selectively turning off one or more of the divide stages if the one or more divide stages is not used for a desired divide ratio; and
correcting an abnormal state of one or more divider stages.

19. The method of claim 18 further comprising programming the divider to produce a selected divide ratio.

20. The method of claim 18 further comprising correcting a duty cycle of an output produced by the divider.

21. The method of claim 20, wherein correcting the duty cycle includes:
generating a first signal having an unbalanced duty cycle;
generating a second signal, wherein the second signal is a delayed version of the first signal; and
logically combining the first signal and the second signal to generate an output signal having a balanced duty cycle.

22. The method of claim 18 wherein correcting the abnormal state includes:
latching an output of a selected portion of a correction circuit, wherein the portion is selected based, at least in part, on a divide ratio to be achieved.

23. A circuit comprising:
means for providing an input clock to a divider, the divider including means for selectively providing a plurality of different divide ratios;
means for clocking each of a plurality of divide stages with the input clock;
means for selectively feeding back an output of at least one of the divide stages to an input of another of the divide stages;
means for selectively turning off one or more of the stages of the divider if the one or more stages is not used for a desired divide ratio; and
means for correcting an abnormal state of one or more stages of the divider.

24. The circuit of claim 23 further comprising means for correcting a duty cycle of an output produced by the divider.

25. The circuit of claim 23 wherein the means for correcting an abnormal state includes means for latching an output of a selected portion of a correction circuit, wherein the portion is selected based, at least in part, on a divide ratio to be achieved.

26. The circuit of claim 23 further comprising means for programming the divider to produce a selected divide ratio.

* * * * *